United States Patent
Peters

(10) Patent No.: US 11,150,608 B2
(45) Date of Patent: Oct. 19, 2021

(54) METHOD FOR TREATMENT OF TIMEPIECE COMPONENTS ON A RACK, AND A RACK

(71) Applicant: ETA SA Manufacture Horlogere Suisse, Grenchen (CH)

(72) Inventor: Jean-Bernard Peters, Pieterlen (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 1148 days.

(21) Appl. No.: 15/286,107

(22) Filed: Oct. 5, 2016

(65) Prior Publication Data

US 2017/0176948 A1    Jun. 22, 2017

(30) Foreign Application Priority Data

Dec. 18, 2015   (EP) ..................................... 15201215

(51) Int. Cl.
*G04D 1/00* (2006.01)
*B25J 15/00* (2006.01)
(Continued)

(52) U.S. Cl.
CPC ........ *G04D 1/0078* (2013.01); *B25J 15/0028* (2013.01); *B25J 15/0052* (2013.01);
(Continued)

(58) Field of Classification Search
None
See application file for complete search history.

(56) References Cited

U.S. PATENT DOCUMENTS 5,245,738 A * 9/1993 Johnson ................ B23P 11/025
                                                                29/413
6,203,760 B1 * 3/2001 van der Plaats ....... B25J 9/1085
                                                                 422/63

(Continued)

FOREIGN PATENT DOCUMENTS

DE      1 941 694      6/1966
FR      1434828      4/1966
(Continued)

OTHER PUBLICATIONS

English translation of JP 60-165394 (original published Aug. 28, 1985) from J-Plat Pat.*

(Continued)

*Primary Examiner* — George Wyszomierski
(74) *Attorney, Agent, or Firm* — Oblon, McClelland, Maier & Neustadt, L.L.P.

(57) ABSTRACT

Method for treatment of timepiece components on a rack including the steps consisting in:
- equipping said rack with grippers made of the same shape memory alloy, and each arranged to return to a reference shape above a martensite finish temperature specific to said alloy;
- bringing said rack to a temperature higher than said martensite finish temperature;
- bringing said rack equipped with said grippers to a preparation temperature;
- loading said rack with a batch of said components to be treated;
- performing said treatment on said rack loaded with said batch;
- unloading said rack.

(Continued)

Rack comprising grippers made of shape memory alloy, arranged to return to a reference shape above a martensite finish temperature specific to said alloy.

5 Claims, 2 Drawing Sheets

(51) Int. Cl.
  *C22F 1/00* (2006.01)
  *C23C 14/24* (2006.01)
  *C25D 1/00* (2006.01)
  *C25D 7/00* (2006.01)
  *G04D 1/06* (2006.01)

(52) U.S. Cl.
  CPC .............. *C22F 1/006* (2013.01); *C23C 14/24* (2013.01); *C25D 1/00* (2013.01); *C25D 7/005* (2013.01); *G04D 1/06* (2013.01)

(56) References Cited

U.S. PATENT DOCUMENTS

| | | | | |
|---|---|---|---|---|
| 6,554,933 B2* | 4/2003 | Riva | ...................... | B60C 15/04 |
| | | | | 156/136 |
| 2008/0101162 A1* | 5/2008 | Born | ...................... | G04B 15/08 |
| | | | | 368/132 |
| 2014/0060036 A1* | 3/2014 | Gao | .......................... | F01P 7/10 |
| | | | | 60/527 |

FOREIGN PATENT DOCUMENTS

| | | |
|---|---|---|
| FR | 2 756 768 | 6/1998 |
| JP | 60-165394 | 8/1985 |

OTHER PUBLICATIONS

European Search Report dated Jun. 9, 2016 in European Application 15201215.9 filed on Dec. 18, 2015 (with English Translation of Categories of cited documents).

* cited by examiner

METHOD FOR TREATMENT OF TIMEPIECE COMPONENTS ON A RACK, AND A RACK

This application claims priority from European Patent Application No. 15201215.9 filed on Dec. 18, 2015, the entire disclosure of which is hereby incorporated herein by reference.

FIELD OF THE INVENTION

The invention concerns a method for treatment of timepiece components on a rack.

The invention concerns such a rack.

The invention concerns the field of the treatment of components on a rack, particularly for the watchmaking and jewellery industries.

BACKGROUND OF THE INVENTION

Electrolytic treatment operations or suchlike, in a bath, include numerous operations to load and unload pieces of equipment called racks or "bouclards", which carry added or integral grippers on which the components to be treated are hung. These operations are of very long duration when they are performed manually, and represent a large part of production costs. The automation of production lines is hampered by the frequent deformation or breakage of the racks and grippers during treatment operations, notably caused by shocks, which is hardly compatible with the use of manipulators serving programmed positions, whose efficiency is in that case very low, making it necessary to resort to operators, or to the use of shape recognition means, which is difficult because of these deformations, which are in all dimensions, and sometimes of amplitudes such that the theoretical field of vision has to be enlarged to take account of them. It nonetheless remains necessary to manually reshape the grippers and the associated costs continue to negatively impact the operation.

DE 1941694 in the name of GREINER Electronic AG discloses a rack for timepiece movement components, with carrying elements made of spring wire having corrugated portions for separating the components carried by the rack, each spring wire being combined with a retaining part able to cover, especially elastically, the free end of the spring wire once the timepiece component(s) have been loaded.

SUMMARY OF THE INVENTION

The invention proposes to reduce the cost of treatments for timepiece components, in particular by overcoming deformation of the grippers which is very detrimental to good operation.

To this end, the invention concerns a method for treatment of timepiece components on a rack according to claim 1.

The invention also concerns such a rack.

BRIEF DESCRIPTION OF THE DRAWINGS

Other features and advantages of the invention will appear upon reading the following detailed description, with reference to the annexed drawings, in which.

DETAILED DESCRIPTION OF PREFERRED EMBODIMENTS

Figure 1:
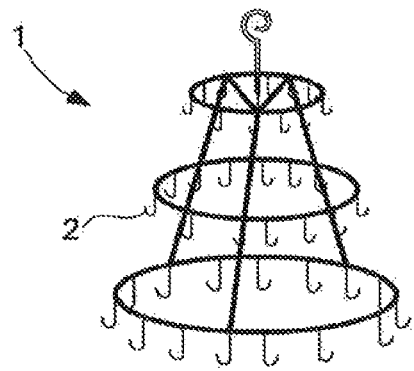
FIG. 1 shows a schematic, perspective view of a rack comprising a plurality of grippers.
Figure 2:
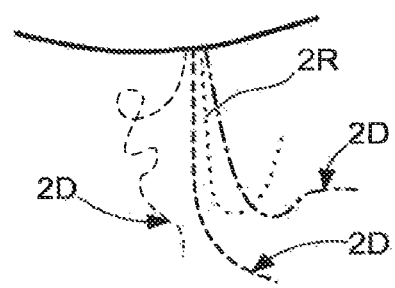
FIG. 2 represents, in a similar manner to FIG. 1, a detail of a hook-shaped gripper, in its reference shape in dotted lines, and two examples of deformation in space in dot and dash lines.
Figure 3:
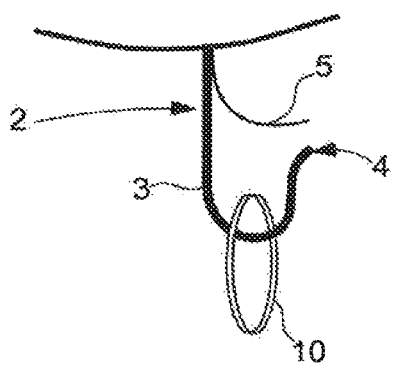
FIG. 3 represents, in a similar manner to FIG. 3, a detail of a hook-shaped gripper, with a second strand forming a mousqueton or snap hook in a closed position around a component.
Figure 4:
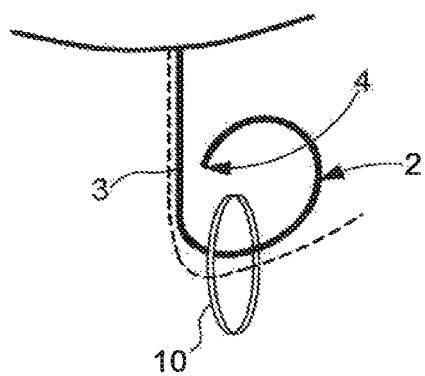
FIG. 4 represents, in a similar manner to FIG. 2, a hook, represented in dotted lines in a first shape at its preparation temperature, and in solid lines loaded with a component and in a second shape occupied by the hook at a treatment temperature.
Figure 5:
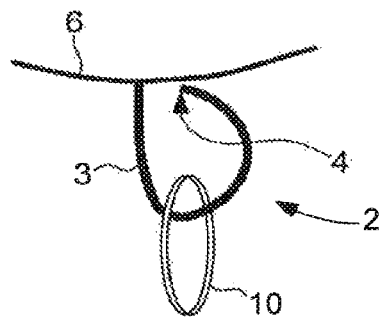
FIG. 5 represents, in a similar manner to FIG. 2, a hook in a position closed around a component and wherein the fastening is at a structure of the rack forming a means of closure.

The invention concerns a method for treatment of timepiece components 10 on a rack 1. A "bouclard" or rack is a structure, generally a frame, or an assembled set of frames, whose shape is adapted both to the means of treatment and to the components to be treated each frame carrying a plurality of grippers 2 of the hook or similar type, intended to receive these components 10. Grippers 2 may, depending on the case, be integral with the structure of rack 1, or removable, which makes it easier to return them to their original shape or to replace them.

The invention utilises the properties of shape memory alloys, which may be used in two ways:

- in order to eliminate accidental deformations, particularly during treatment, the property called "one-way" shape memory is used, by bringing the object to a sufficiently high temperature, at least above the martensite finish temperature Mf of the alloy, and advantageously above the austenite finish temperature Af of the alloy, at which the memory effect is complete;
- in order to use the "two-way" memory effect, whereby an object takes a first microscopic structure below the martensite finish temperature Mf, and a second microscopic structure above, this transformation being reversible and occurring instantaneously.

The main object of the invention is to save cycle time in connection with treatment operations, and, to this end, to eliminate time wasted in locating and righting grippers deformed during a treatment, particularly by shocks. Intervention is especially necessary at the start of a production cycle, when a rack 1 is ready to be loaded with components 10 to be treated.

This method includes the successive steps consisting in:
- (10) equipping rack 1 with a plurality of grippers 2, all made of the same shape memory alloy, and each arranged to return to a reference shape with memory effect through heating above a martensite finish temperature Mf specific to this shape memory alloy;
- (11) bringing rack 1 equipped with grippers 2 to a temperature higher than the martensite finish temperature Mf;
- (12) once all the grippers have returned to their reference shape, bringing rack 1 equipped with grippers 2 to a preparation temperature TP;

(13) loading rack 1, at a loading station at preparation temperature TP, with a batch of components 10 to be treated;

(14) performing the treatment on rack 1 loaded with the batch:

(15) unloading the treated components 10 from rack 1.

An optional operation consists in performing another search for the reference shape of the grippers, at the end of a treatment cycle, before the treated components 10 are unloaded from rack 1. However, the volume of the treated components 10 is generally sufficient to enable localization by manipulator means, even if the grippers are deformed. In the case when this optional operation is performed, the additional operations consist in:

after completion of the treatment, returning rack 1 loaded with the batch to a temperature higher than the martensite finish temperature Mf;

and then bringing rack 1 loaded with the batch back to preparation temperature TP, before unloading the components.

More specifically, in a periodic operation, but not necessarily with each cycle, the method includes the following steps:

equipping rack 1 with a plurality of grippers 2, all made of the same shape memory alloy, and each arranged to return to a reference shape with one-way memory effect through heating above an austenite finish temperature Af specific to the shape memory alloy, this temperature Af being the temperature above which the gripper was brought after its initial shaping, giving it the reference shape, to which it returns each time that it crosses this temperature, bringing rack 1 equipped with grippers 2 to a temperature higher than the austenite finish temperature Af;

once all the grippers have returned to their reference shape, bringing rack 1 equipped with grippers 2 to a preparation temperature TP;

loading rack 1, at a loading station at preparation temperature TP, with a batch of components 10 to be treated;

performing the treatment on rack 1 loaded with the batch:

unloading the treated components 10 from rack 1.

In the same manner as previously, a search can be made for the reference shape of the grippers at the end of the cycle, with operations consisting in:

after completion of the treatment, returning rack 1 loaded with the batch to a temperature higher than the austenite finish temperature Af;

and then bringing rack 1 loaded with the batch back to preparation temperature TP, before unloading the components.

In a particular implementation of the invention, rack 1 is equipped with grippers 2 which each comprise a first strand 3 with at least one distal end 4 arranged for attachment of a component 10. These grippers 2 may, in particular, take the form of a hook or similar shape.

Thus, use is made of the ability of a shape memory alloy to return to its reference shape above the austenite finish temperature Af, even if the gripper was deformed during the preceding treatment, or when handled outside the treatment chain. Its distal end 4, which may have taken any position in space, thus returns to its theoretical position, and a programmed manipulator can find it without any particular problem. The very significant time saving that ensues is a major advantage of the invention, the other important advantage consisting in avoiding manual operations to right the grippers after treatment, usually performed by line pipe treatment operators.

In the case of components 10 of very small size, or of a particular precision, or requiring a particular orientation on gripper 2, position determining means may advantageously additionally be used, such as cameras or suchlike, when rack 1 is loaded with the batch of components 10 to be treated, or when it is unloaded at the end of a cycle, to identify and check the position of each distal end 4 of each gripper 2 to guide thereto a component 10, loaded in particular by a manipulator means. However, it is understood that returning to the reference shape may, in many cases, obviate the presence of such position determining means, which reduces the equipment cost of the production lines.

In a variant, first strand 3 of gripper 2 is open at preparation temperature TP, and is arranged to be closed in a loop on itself, closing around a component 10, when a macroscopic mechanical deformation is imparted by a user or a manipulator means. In a first alternative, the reference shape is the closed shape, and, for example through a mechanical deformation under the action of a manipulator robot, the gripper is deliberately made to open at the preparation temperature, in order to load it with a component 10, closure around component 10 then being effected, either by another mechanical deformation action, or by a sufficient rise in temperature to return the gripper to the reference shape, depending on the features of the treatment implemented. Preferably the opposite alternative is used, wherein the reference shape is the open shape, in which gripper 2 appears at the preparation station, and wherein closure around component 10 is effected, either by a mechanical deformation action, or by a sufficient rise in temperature to return the gripper to the reference shape.

In another variant, rack 1 is equipped with grippers 2 which comprise, opposite their distal end 4, a second strand 5 arranged to form with first strand 3 a loop that can be closed around a component 10, like a mousqueton or snap hook, with the same type of mechanical deformation as before. Advantageously, at least one such second strand 5, and preferably each second strand 5, is made of the same shape memory alloy as grippers 2.

In yet another variant, rack 1 is equipped with at least one means of closure 6 facing at least one distal end 4, and arranged to form, with at least a first strand 3, a loop that can be closed around a component 10, like a mousqueton or snap hook, with the same type of mechanical deformation as before. For example, when grippers 2 are in the form of hooks arranged at the periphery of a circle, the means of closure 6 may consist of a ring closing in one stroke all of the components 10 placed on grippers 2. Advantageously, at least one such means of closure 6, and preferably each means of closure 6, is made of the same shape memory alloy as grippers 2.

It may be very useful to hold components 10 closed in this manner when, due to their density, the components tend to float at the surface of treatment baths, such as components made of plastic material, or foam, or simply to ensure the secure holding of expensive components.

Figure 6:
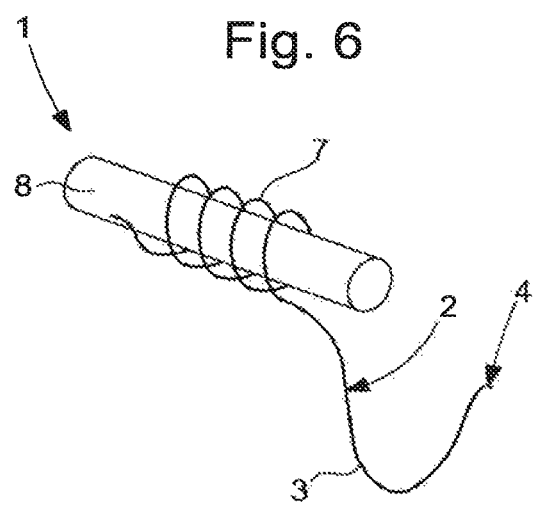
FIG. 6 represents a hook-shaped gripper comprising a spring portion for the securing thereof to a support element of a rack.
Figure 7:
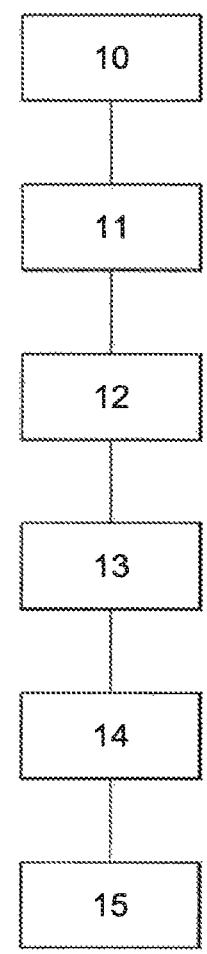
FIG. 7 is a block diagram illustrating the steps of the method according to the invention.

In another advantageous variant, grippers 2 are removable, to facilitate the righting thereof by returning them to their reference shape, or the replacement thereof in the event of breakage or wear. In particular, the grippers comprise at least one spring portion 7, arranged to cooperate with elastic retention on a support element 8 of rack 1 or to hold the gripper by another means, such as screws, clamps or suchlike. FIG. 6 illustrates such an embodiment with a hook-shaped gripper 2 extended by a spiral helical spring force fitted onto a pin 8 forming the support element of rack 1.

The treatment concerned may consist of an electrolytic or electroplating or electroforming treatment or a PVD or similar type of treatment, and each gripper 2 is in that case an electrical conductor electrically connected to rack 1.

Advantageously, the loading and unloading of rack 1 are performed by an automated manipulator at preparation temperature TP.

The treatment is preferably effected at a treatment temperature TT, which is higher than the Mf value and notably on the order of 90° C. for a nickel-titanium shape memory alloy.

Preparation temperature TP may have different values: it could, for memory, be higher than or equal to the martensite finish temperature Mf. More particularly, preparation temperature TP could also be higher than or equal to the austenite finish temperature Af, i.e. the loading or unloading would be performed at the temperature to which the assembly is brought in order to return it to its reference shape, but this temperature is on the order of 400° C. to 550° C. for a nickel-titanium type shape memory alloy, which is very high and not suitable for industry, due to heating costs, and is liable to damage the insulating layer usually covering all or part of the rack structure, to avoid depositing any plating material on said structure.

More usually, the preparation temperature TP is an ambient temperature lower than the martensite finish temperature Mf, which facilitates handling but involves a period of temperature drop. It is understood that implementation of the invention does not necessarily require an increase in temperature above the austenite finish temperature Af with each cycle, due to heating costs, and the time of temperature increase, and period of drop to the preparation temperature. Testing can determine an acceptable frequency, for example on the order of once per shift or per day, or per week, or every n batches, or suchlike. The invention also enables the grippers to be returned to their reference shape outside the production cycle, either on the equipped rack, or individually, for example with the grippers loose which is very advantageous as regards the cost of the temperature increase, in an operation which may be performed in concurrent time.

This method is preferably implemented for the treatment of timepiece or jewellery components, or micro-mechanical components, where the volume of components and dimensional accuracy require very accurate positioning, and optimum protection of the components, which the invention can ensure.

The invention also concerns a rack 1 as specifically devised and described above for implementation of the method.

The invention also concerns a gripper 2 according to the features described above.

What is claimed is:

1. A rack for the treatment of timepiece components, said rack comprising
   a plurality of grippers adapted to the geometry and to the treatment of said timepiece components,
   wherein each of said plurality of grippers is made of the same shape memory alloy and arranged to return to a reference shape through heating above a martensite finish temperature specific to said shape memory alloy,
   wherein at least one of the plurality of grippers includes a first strand which is open in the reference shape and configured to be closed on itself in a loop closing around the component during a mechanical deformation, and
   the at least one of the plurality of grippers includes opposite a distal end of the first strand, a second strand configured to form with the first strand a loop closing around the component during a mechanical deformation.

2. The rack according to claim 1, wherein each of said plurality of grippers is arranged to return to a reference shape through heating above an austenite finish temperature specific to said shape memory alloy.

3. The rack according to claim 1, wherein at least one said gripper is removable.

4. The rack according to claim 1, wherein each of the plurality of grippers having a reference shape that is open to allow placement of the timepiece component on the gripper; and each of said plurality of grippers closes around a timepiece component placed on the gripper due to a sufficient rise in temperature.

5. A rack for the treatment of timepiece components, said rack comprising:
   a plurality of grippers adapted to the geometry and to the treatment of said timepiece components; and
   a support element provided within the rack,
   wherein each of said plurality of grippers is made of a same shape memory alloy, and arranged to return to a reference shape through heating above a martensite finish temperature specific to said shape memory alloy,
   wherein at least one of the plurality of grippers includes a first end portion having at least one spring portion, arranged to cooperate with elastic retention on the support element comprised in said rack, the at least one of the plurality of grippers includes a second end portion projecting away from and out of contact with the support element and configured to engage the timepiece components, and
   wherein the at least one spring portion is wound around the support element.

* * * * *